(12) United States Patent
Yoo et al.

(10) Patent No.: US 7,741,206 B2
(45) Date of Patent: Jun. 22, 2010

(54) PAD STRUCTURE FOR LIQUID CRYSTAL DISPLAY AND METHOD OF MANUFACTURING THEREOF

(75) Inventors: Soon Sung Yoo, Kyoungsangbuk-do (KR); Dong Yeung Kwak, Daegu-shi (KR); Hu Sung Kim, Seoul (KR); Yong Wan Kim, Kyoungsangbuk-do (KR); Dug Jin Park, Daegu-shi (KR); Yu Ho Jung, Kyoungsangbuk-do (KR); Woo Chae Lee, Seoul (KR)

(73) Assignee: LG Display Co., Ltd., Seoul (KR)

( * ) Notice: Subject to any disclaimer, the term of this patent is extended or adjusted under 35 U.S.C. 154(b) by 222 days.

(21) Appl. No.: 11/889,184

(22) Filed: Aug. 9, 2007

(65) Prior Publication Data

US 2008/0026558 A1    Jan. 31, 2008

Related U.S. Application Data

(62) Division of application No. 09/894,874, filed on Jun. 29, 2001, now Pat. No. 7,262,827.

(30) Foreign Application Priority Data

Jul. 26, 2000   (KR) ............................. P 2000-43184

(51) Int. Cl.
    *H01L 21/00* (2006.01)
(52) U.S. Cl. ..................... 438/612; 438/613; 438/30
(58) Field of Classification Search ............. 438/30, 438/612, 613
    See application file for complete search history.

(56) References Cited

U.S. PATENT DOCUMENTS

| | | | |
|---|---|---|---|
| 5,187,604 A | 2/1993 | Taniguchi et al. | |
| 5,492,582 A | 2/1996 | Ide et al. | |
| 5,636,329 A | 6/1997 | Sukegawa et al. | |
| 5,893,625 A | 4/1999 | Tamatani et al. | |
| 5,966,589 A | 10/1999 | Watanabe et al. | |
| 5,990,986 A * | 11/1999 | Song et al. | 349/43 |
| 6,016,174 A | 1/2000 | Endo et al. | |
| 6,081,308 A * | 6/2000 | Jeong et al. | 349/42 |
| 6,143,189 A | 11/2000 | Glueck et al. | |
| 6,184,966 B1 | 2/2001 | Fujita et al. | |
| 6,204,081 B1 * | 3/2001 | Kim et al. | 438/30 |
| 6,255,130 B1 * | 7/2001 | Kim | 438/30 |
| 6,310,667 B1 | 10/2001 | Nakayoshi et al. | |
| 7,262,827 B2 * | 8/2007 | Yoo et al. | 349/150 |
| 7,375,787 B2 * | 5/2008 | Cheng et al. | 349/151 |
| 7,582,966 B2 * | 9/2009 | Lin et al. | 257/734 |

(Continued)

FOREIGN PATENT DOCUMENTS

JP    03-221923    9/1991

(Continued)

*Primary Examiner*—Laura M Menz
(74) *Attorney, Agent, or Firm*—McKenna Long & Aldridge

(57) ABSTRACT

A liquid crystal display has a pad structure. The pad structure includes at least one pad formed on a substrate, an insulating film formed on the pad, and at least one conductive layer connected to the pad through contact holes defined through the insulating film. The insulating film covers side surfaces of the pad and a portion of the substrate adjacent to the side surfaces of the pad.

6 Claims, 7 Drawing Sheets

U.S. PATENT DOCUMENTS

| | | | |
|---|---|---|---|
| 2002/0044250 A1* | 4/2002 | Yoo et al. | 349/149 |
| 2004/0158808 A1 | 8/2004 | Hansen | |
| 2008/0026558 A1* | 1/2008 | Yoo et al. | 438/612 |

FOREIGN PATENT DOCUMENTS

| | | |
|---|---|---|
| JP | 03-3289627 | 12/1991 |
| JP | 06-003658 | 1/1994 |
| JP | 10-213818 | 8/1998 |
| KR | 10-0210625 | 4/1999 |

* cited by examiner

PAD STRUCTURE FOR LIQUID CRYSTAL DISPLAY AND METHOD OF MANUFACTURING THEREOF

This is a divisional application of application Ser. No. 09/894,874 filed on 29 Jun. 2001, now U.S. Pat. No. 7,262,827 which claims the benefit of Korean Patent Publication No. 2000 43184 filed on 26 Jul. 2000, both of which are hereby incorporated by reference for all purposes as if fully set forth herein.

The present invention claims the benefit of Korean Patent Application No. 2000-43184 filed in Korea on Jul. 26, 2000, which is hereby incorporated by reference.

BACKGROUND OF THE INVENTION

1. Field of the Invention

The present invention generally relates to a display device and, more particularly, to pads for an LCD (Liquid Crystal Display) and a manufacturing method thereof.

2. Description of the Related Art

CRTs (Cathode Ray Tubes) have been the primary type of display device for instrumentation system monitors, information system terminals, and televisions. However, conventional CRTs have not been able to respond to the need to manufacture electronic products with reduced size and weight because CRTs are fundamentally large and heavy.

LCDs (Liquid Crystal Displays), which are relatively thin and light weight, have been developed to replace the conventional CRT. In recent years, LCDs have begun to play an important role as a plat-type display device, thereby increasing market demand for LCDs.

Generally, a low cost, high performance thin film transistor-LCD (TFT-LCD) employs a non-crystalline silicone thin film transistor as a switching element. Currently, most LCD development is directed toward high resolution systems such as SVGA (800×600) and XVGA (1024×768) as compared to VGA (Video Graphic Array; maximum resolution: 640×480 pixels). Consequently, development and application of the TFT-LCD industry have been accelerated due to increase in size and enhancement in resolution. As a result, there have been many attempts to increase manufacturing productivity and decrease cost by simplifying manufacturing processes and improving manufacturing yield.

The LCD uses an electrooptical property of liquid crystals that are injected into an inside of a panel. In contrast to a PDP (Plasma Display Panel), a FED (Field Emission Display), etc., the LCD can not emit light itself. Hence, an LCD is provided with a back light as a separate light source to evenly emit light onto a display surface, thereby displaying a picture on the LCD panel.

Conventional LCD pads will now be explained with reference to FIGS. 1 and 2. FIG. 1 is a sectional view of a gate pad of the conventional LCD, and FIG. 2 is a sectional view of a conventional data pad.

As shown in FIG. 1, the conventional gate pad comprise three areas: a pad contact area I, a grinding area II, and an ACF (Anisotropic Conductive Film) deposit area III. A pattern on the grinding area II is removed before the ACF is deposited. The pad contact area I is in contact with the grinding area II at one side and extends beyond the ACF deposit area III at another side. As such, the gate pad comprises a gate metal 13 formed on a substrate 11; a protective film 17 and a gate insulating film 15 having a plurality of contact holes thereon through which a portion of the surface of the gate metal 13 is selectively exposed, and being sequentially laminated on an upper part of the gate metal 13; a transparent metal layer 19 connected to the gate metal 13 through the contact holes; an ACF 21 formed on an upper part of the transparent metal layer 19 in the ACF deposit area III; and a tape carrier package (TCP) layer 23 formed on the ACF 21.

Here, the transparent metal layer 19 is made of a layer of a transparent conductive material, such as ITO (Indium Tin Oxide), for use as a pixel electrode of an active region. Accordingly, a gate signal can be inputted from the TCP layer 23 to be transmitted to the gate metal 13 through the ACF 21 and through the transparent metal layer 19 and then transmitted to a thin film transistor (not shown) disposed within the active region.

The transparent metal layer 19 is formed in the pad contact area I such that most portions of the transparent metal layer 19 are covered by the ACF 21. However, a portion F1 of the transparent metal layer 19 at a side of the active region is not covered by the ACF 21 and is exposed. Further, some parts of the contact holes, which serve as a passageway for transmitting the gate signal inputted from the TCP layer 23 to the gate metal 13, exist beyond the ACF deposit area III.

Furthermore, before the ACF 21 is deposited, the gate metal 13, the gate insulating film 15, the protective film 17 and the transparent metal layer 19 in the grinding area II are removed. When the grinding process is completed, there is formed a portion F2 in which sectional surfaces of the gate metal 13 and the transparent metal layer 19 are exposed to ambient air.

The LCD of FIG. 1 further shows a color filter substrate 32 facing the substrate 11, and a sealing compound 30 for bonding the substrate 11 to the color filter substrate 32.

As shown in FIG. 2, the structure of a data pad is similar to that of the gate pad with the exception that there is a different width of each pattern and pitch between the patterns. Accordingly, the data pad also comprises a pad contact area I, an ACF deposit area III, and a grinding area II. The pad contact area I contacts the grinding area II at one side and extends beyond the ACF deposit area III at the other side at a side of an active region.

As such, the data pad comprises a substrate 11; a source/drain metal 16 formed on an upper part of a gate insulating film 15; a protective film 17, formed on an upper part of the source/drain metal 16, having a plurality of contact holes through which a surface of the source/drain metal 16 is selectively exposed; a transparent metal layer 19, formed in the pad contact area I, connected to the source/drain metal 16 through the contact holes; an ACF 21 formed in the ACF deposit area III; and a TCP layer 23 formed on an upper part of the ACF 21. Therefore, a data signal inputted from the TCP layer 23 is transmitted to the source/drain metal 16 through the ACF 21 and through the transparent metal layer 19, and then transmitted to a thin film transistor (not shown) within the active region.

In the data pad, similarly to the gate pad, the transparent metal layer 19 exists within the pad contact area I. Most portions of the transparent metal layer 19 are covered by the ACF 21, but a portion F3 existing beyond the ACF deposit area III is exposed. The source/drain metal 16, the protective film 17 and the transparent metal layer 19 in the grinding area II are sequentially removed. When the grinding process is completed, there exists a portion F4, in which sectional surfaces of the source/drain metal 16 and the transparent metal layers 19 are exposed.

The conventional LCD pads have a number of disadvantages. For example, conventional LCD pads are prone to atmospheric corrosion or electrolytic corrosion.

If an electrical signal is applied to the gate pad to be operated, the sectional surfaces of the gate metal and the transparent metal layer exposed after the grinding process, or the portion of the transparent metal layer uncovered by the ACF may raise an electrochemical reaction which increases the possibility of atmospheric corrosion or electrolytic corrosion on a portion of the gate metal, thereby leading to damage of the gate pad. That is, the thin film transistor is damaged due to a fine electrical shock generated during the electrochemical reaction, and the resistance of the gate wiring increases due to the atmospheric corrosion and the electrolytic corrosion of the gate metal.

If an electrical signal is applied to the data pad to be operated, an electrochemical reaction may be induced in the sectional surfaces of the source/drain metal and the transparent metal layer exposed after the grinding process or the portion of the transparent metal layer uncovered by the ACF which increases the possibility of atmospheric corrosion or electrolytic corrosion on a portion of the source/drain metal, thereby leading to damage of the data pad. That is, the thin film transistor is damaged due to a fine electrical shock generated during the electrochemical reaction, and the resistance of the data wiring increases due to the atmospheric corrosion and the electrolytic corrosion of the source/drain metal.

SUMMARY OF THE INVENTION

Accordingly, the present invention is directed to a liquid crystal display pad that substantially obviates one or more of the problems due to limitations and disadvantages of the related art.

An object of the present invention is to provide an LCD (Liquid Crystal Display) pad and a manufacturing method thereof, which can prevent properties of an LCD from being deteriorated by using improved gate and data pads sufficiently resistible against an electrolytic corrosion or a corrosion.

Additional features and advantages of the invention will be set forth in the description that follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the present invention, as embodies and broadly described, a pad structure for a liquid crystal display comprises a substrate; a plurality of gate pads and data pads formed on the substrate; an insulating film formed on surfaces of the gate pads and data pads; a plurality of transparent conductive layers electrically connected to the gate pads and the data pads; and an anisotropic conductive film formed on the transparent conductive layers to cover entire upper and side surfaces of the transparent conductive layer.

In another aspect, a pad structure for a liquid crystal display with a grinding area, a pad contact area and an anisotropic conductive film deposit area comprises a tape carrier package layer to receive a driving signal; an anisotropic conductive film formed on a lower portion of the tape carrier package layer and covering at least the pad contact area of the liquid crystal display; an insulating film defining a plurality of contact holes therethrough, the insulating film disposed on a lower portion of the anisotropic conductive film in the pad contact area of the liquid crystal display; a plurality of gate and data pads; and a transparent conductive layer electrically connecting the gate and data pads to the anisotropic conductive film through the contact holes, wherein upper and side surfaces of the gate and data pads are completely covered by the insulating film and the transparent conductive layer.

In another aspect, a method for manufacturing a liquid crystal display having a pad structure comprises the steps of forming a plurality of gate pads at predetermined portions on a substrate; forming an insulating film to cover the gate pads; forming data pads on the insulating film; forming a protective film to cover the data pads; exposing portions of the gate and data pads; forming a transparent conductive layer to be electrically connected to the exposed portions of the gate and data pads; and forming an anisotropic conductive film on the transparent conductive layer to entirely cover upper and side surfaces of the transparent conductive layer.

In another aspect, a method for manufacturing a pad structure on a liquid crystal display with a grinding area and a pad contact area comprises the steps of forming gate pads on a substrate separated by a distance from a grinding area defined on the substrate; forming a gate insulating film on the substrate and the gate pads; forming data pads on the gate insulating film separated by a distance from the grinding area; forming a protective film on the substrate and the data pads; forming a transparent conductive film to be connected to the gate pads and the data pads in the pad contact area via contact holes defined in the gate insulating film and the protective film; and forming an anisotropic conductive film on the transparent conductive film to entirely cover upper and side surfaces of the transparent conductive film.

In another aspect, a pad structure for a liquid crystal display comprises a substrate; at least one pad formed on the substrate; an insulating film formed on the pad, the insulating film covering side surfaces of the pad and a portion of the substrate adjacent to the side surfaces of the pad; and at least one conductive layer connected to the pad through contact holes defined through the insulating film.

In another aspect, a liquid crystal display formed on a substrate comprises an active region defined at a first portion of the substrate; and a pad contact area defined on a second portion of the substrate adjacent to the active region wherein the pad contact area includes at least one pad formed on the substrate, an insulating film formed on the pad, at least one conductive layer connected to the pad through contact holes defined through the insulating film such that the insulating film covers side surfaces of the pad and a portion of the substrate adjacent to the side surfaces of the pad.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

As will be explained in detail below, the gate and data pads and according to the present invention have contact holes formed within an ACF deposit area to transmit a gate signal and a data signal inputted from a TCP layer to a gate metal or a source/drain metal. Sectional surfaces of the transparent metal layer and the gate metal or the source/drain metal layer are protected from being exposed to ambient air after the grinding process, thereby preventing corrosion and/or electrolytic corrosion of the source/drain metal, the gate metal, or the transparent conductive layer.

Figure 1:
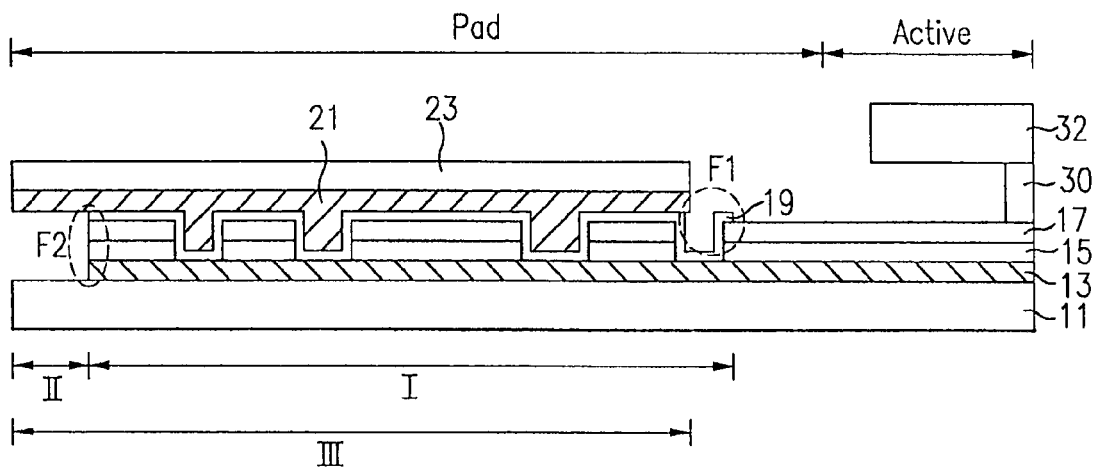
FIG. 1 is a sectional view of a gate pad of a conventional LCD (Liquid Crystal Display)
Figure 2:
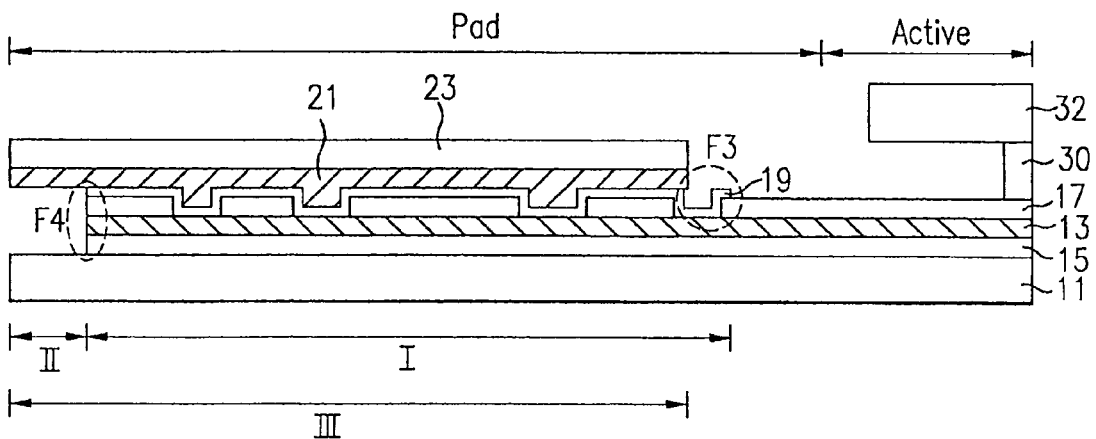
FIG. 2 is a sectional view of a data pad of the conventional LCD.
Figure 3:
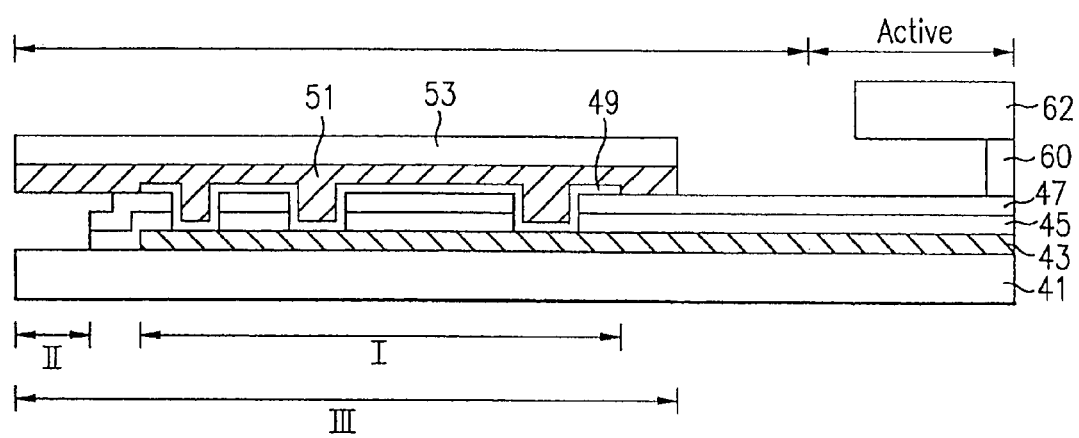
FIG. 3 is a sectional view of a gate pad of an LCD in accordance with the present invention.

Initially, a gate pad according to the present invention, as shown in FIG. 3 for example, is divided into an ACF (Anisotropic Conductive Film) deposit area III, a pad contact area I, and a grinding area II. Here, the pad contact area I is spaced from the grinding area II by a predetermined interval and the pad contact area exists within the ACF deposit area. The pad contact area I transmits a gate signal inputted through an ACF to a gate metal 43. The pad contact area I has a plurality of contact holes through which a surface of the gate metal 43 is exposed and also has a transparent metal layer 49 connected to the gate metal 43 through the contact holes.

Referring to FIG. 3, the gate pad comprises a substrate 41 including an active region, and a pad region being divided into the grinding area II, the pad contact area I and the ACF deposit area III; a first metal layer 43 formed on the substrate in the pad contact area I and the active region; a gate insulating film 45 and a protective film 47 laminated on the substrate including the first metal layer 43 and having the plurality of contact holes through which a surface of the first metal layer 43 is exposed within the pad contact area I; the transparent metal layer 49 electrically connected to the first metal layer 43 through the contact holes and being formed within the pad contact area I; the ACF 51 formed in the ACF deposit area III to sufficiently cover the transparent metal layer 49; and a TCP layer 53 formed on the ACF 51. Generally, the LCD device further includes a color filter substrate 62 and a sealing compound 60 for sealing the two substrates (i.e., the substrate 41 and the color filter substrate). The first metal layer 43 of FIG. 3 is the gate metal connected to a thin film transistor in the active region. The transparent metal layer 51 may be made of a transparent conductive material, such as, ITO (Indium Tin Oxide), which may be used as a pixel electrode of the active region.

In the gate pad configured as above, since the transparent metal layer 49 and the contact holes transmitting the gate signal inputted from the ACF 51 to the first metal layer 43, as well as the first metal layer 43 used as the gate metal exist within the ACF 51, there is no danger of exposing the transparent metal layer 49 or the contact holes to ambient air. Further, since the first metal layer 43 adjacent to the grinding area II is covered by the gate insulating film 45 and the protective film 47 and the transparent metal layer 49 is covered by the ACF 51, even if all process including a grinding process are finished and an electrical signal is applied for operation, there are prevented the first metal layer 43 and the transparent metal layer 49 from being affected by any corrosion and electrolytic corrosion due to a moisture.

To be specific, there is no possibility that the transparent metal layer 49 adjacent to the grinding area II and the first metal layer 43 are corroded due to a moisture, or electrolytically corroded due to an electrochemical reaction between the metals. Since the transparent metal layer 49 adjacent to the active region and the contact holes exists within the ACF 51, they will not suffer from corrosion or electrolytic corrosion as a result of their exposure to ambient air.

A method for manufacturing the gate pad according to the present invention will now be explained with reference to FIGS. 4A through 4F. For reference, the pad region and the active region are manufactured through common process. However, a preferred embodiment of the present invention will be explained based on the process performed in the pad region.

Figure 4A:
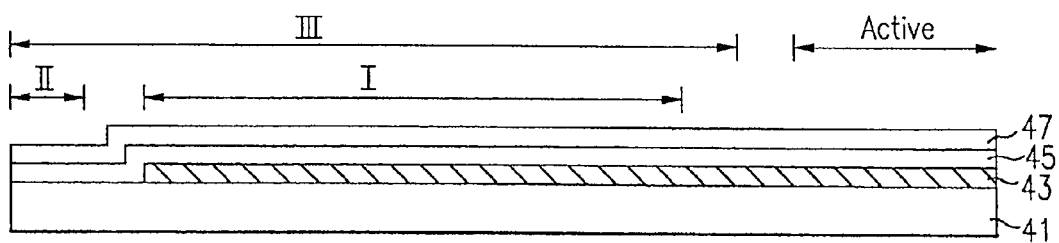
FIGS. 4A through 4F are sectional views illustrating a process for manufacturing the gate pad of FIG. 3.

As depicted in FIG. 4A, the first metal layer 43 acts as the gate metal and is formed on the substrate 41, which is comprised of the active region, and the pad region. The pad region is divided into the ACF deposit area III, the pad contact area I, and the grinding area II. Here, the first metal layer 43 is separated by a predetermined interval from the grinding area II and extends beyond the pad contact area I to the active region.

Thereafter, the gate insulating film 45 is formed on a front surface of the substrate 41 including the first metal layer 43, and the protective film 47 is formed on the gate insulating film 45. A photoresist (not shown) is coated on the protective film 47, and is patterned through an exposure and development process.

Figure 4B:
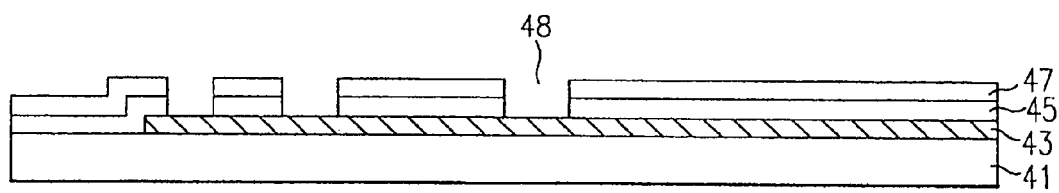

As shown in FIG. 4B, the plurality of contact holes 48 are formed within the pad contact area I through an engraving process in which the patterned photoresist is used as a mask. At this time, the thin film transistor (not shown) is formed on the active region.

Figure 4C:
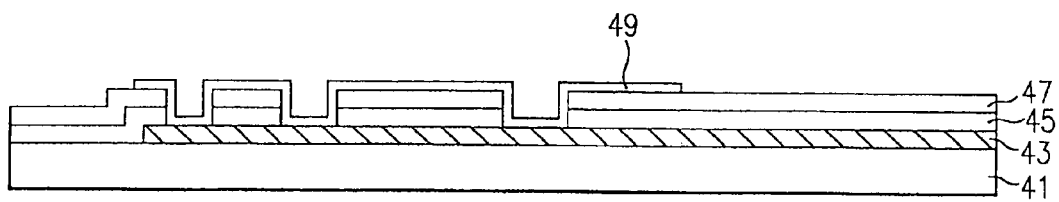

Subsequently, as illustrated in FIG. 4C, the transparent metal layer 49 is formed within the pad contact area I to be electrically connected to the first metal layer 43 through the contact holes 48. Here, the transparent metal layer 49 is patterned so as to be formed within the pad contact area I. A pixel electrode is formed on the active region and the transparent metal layer 49 is materialized of the same ITO as the above pixel electrode. This is because that the active region and the pad region are processed at the same time. If the transparent metal layer 49 is formed at the same time when the pixel electrode of the active region is formed of the ITO, the process is simplified and an additional mask is not needed, in comparison with a case that a separate transparent metal layer is formed. The transparent metal layer 49 does not need to be made of the same ITO as the pixel electrode. Instead, the transparent metal layer 49 can be made of any material having a high electric conductivity and a high adhesivity to the anisotropic conductive film (ACF).

Figure 4D:
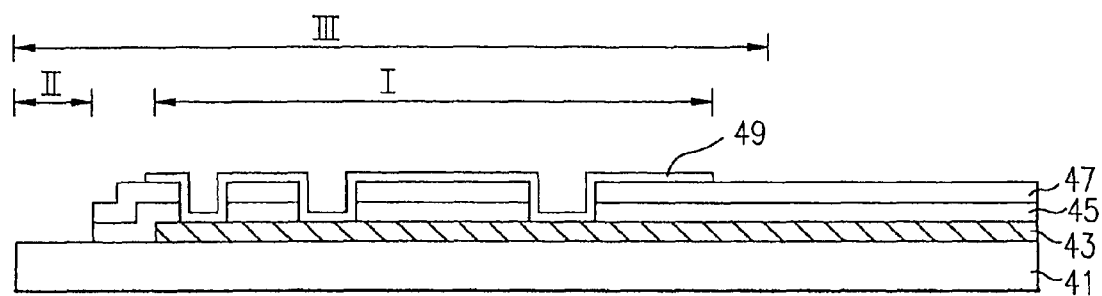
Figure 4E:
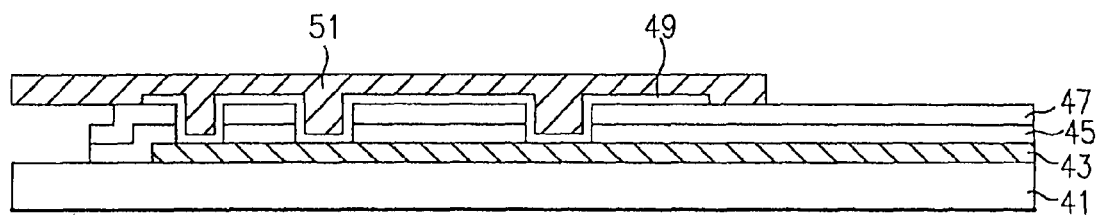

Next, as shown in FIG. 4D, the gate insulating film 45 and the protective film 47 in the grinding area II are ground. As shown in FIG. 4E, the ACF 51 is formed to entirely cover the pad contact area I. At this time, edge portions of the first metal layer 43 contiguous to the grinding area II are covered by the gate insulating film 45 and the protective film 47, and the transparent metal layer 49 is covered by the ACF 51.

Figure 4F:
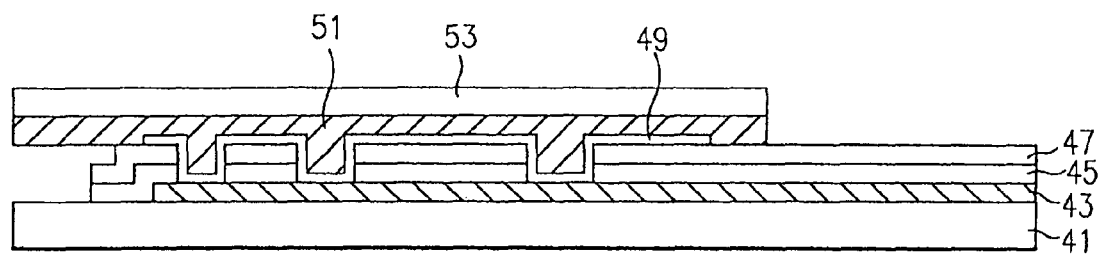

After that, as shown in FIG. 4F, the tape carrier package (TCP) layer 53 is formed on an upper part of the ACF 51, thereby completing the manufacturing of the exemplary gate pad according to the present invention.

In the method of manufacturing the gate pad according to the present invention, since the first metal layer 43 contiguous to the grinding area II is covered by the gate insulating film 45 and the transparent metal layer 49 is covered by the ACF 51, there is no danger that the edge portions of the first metal layer 43 and the transparent metal layer 49 would be exposed to ambient air after the grinding process. In addition, since the plurality of contact holes 48 within the pad contact area I and the transparent metal layer 49 contiguous to the active region are covered by the ACF 51, edge portions of the contact holes and the transparent metal layer 49 have no danger of being exposed to ambient air.

Figure 5:
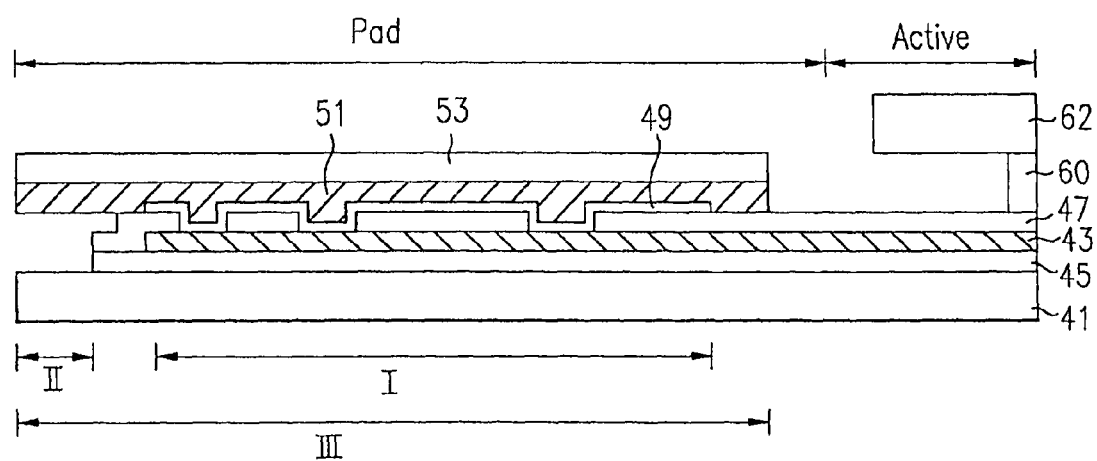
FIG. 5 is a sectional view of a data pad of an LCD in accordance with the present invention.

The data pad according to the present invention will be explained herein below with reference to FIG. 5. FIG. 5 shows a sectional view of the data pad according to the present invention.

Referring to FIG. 5, the data pad, similarly to the gate pad, generally comprises an ACF (Anisotropic Conductive Film) deposit area III, a pad contact area I, and a grinding area II. The grinding area II is separated by a predetermined interval from the pad contact area I. The pad contact area I is formed within the ACF deposit area III. Here, the pad contact area I includes a plurality of contact holes and a transparent metal layer 49 connected to a first metal layer 43 through the contact holes.

To be specific, as depicted in FIG. 5, the data pad comprises a substrate 41, which includes a pad region (the pad region being divided into the grinding area II, the pad contact area I, and the ACF deposit area III, and an active region with a thin film transistor and a pixel electrode being formed on the active region); a gate insulating film 45 formed on the substrate 41; the first metal layer 43 formed on the gate insulating film over the pad contact area I and the active region; a protective film 47 laminated on the gate insulating film 45 including the first metal layer 43 and having the plurality contact holes through which a surface of the first metal layer 43 is exposed; the transparent metal layer 49 electrically connected to the first metal layer 43 through the contact holes and being formed within the pad contact area I; an ACF formed on the ACF deposit area III to sufficiently cover the transparent metal layer 49; and a tape carrier package (TCP) layer 53 formed on the ACF 51.

Generally, an LCD further comprises a color filter substrate 62 and a sealing compound 60 to bond the two substrates (i.e., the substrate 41 and the color filter substrate). The first metal layer 43 may be a source/drain metal formed at the same time as the source/drain electrode and data wiring in the active region. Further, the transparent metal layer 49 is preferably made of the same material as that of a pixel electrode of the active region and formed at the same time with the pixel electrode.

In the data pad according to the present invention, since the transparent metal layer 49 and the contact holes transmit a data signal inputted through the ACF 51 to the first metal layer 43 are formed within the ACF 51, the transparent metal layer 49 and the contact holes do not become exposed. Accordingly, even if all process including a grinding process are completed and an electrical signal is applied for operation, moisture will not infiltrate into the first metal layer 43 contiguous to the grinding area II, which is covered by the protective film 47, or into the transparent metal layer 49, which is covered by the ACF 51.

As a result, the transparent metal layer 49 and the first metal layer 43 adjacent to the grinding area II will not be corroded due to moisture and will not be electrolytically corroded due to an electrochemical reaction between the metals. Further, there is no concern that the transparent metal layer 49 adjacent to the active region and the contact holes are corroded or electrolytically corroded since they are covered by the ACF 51 so as to be isolated from the outside.

A method for manufacturing the data pad will now be explained with reference to FIGS. 6A through 6F.

Figure 6A:
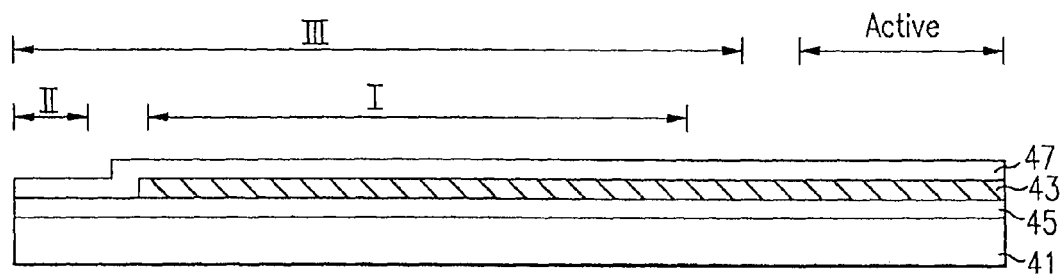
FIGS. 6A through 6F are sectional views illustrating a process for manufacturing the data pad of FIG. 5.

Referring to FIG. 6A, the gate insulating film 45 is formed on the substrate 41, which includes the active region, and the pad region being divided into the ACF deposit area III, the pad contact area I and the grinding area II. After that, the first metal layer 43 is formed on the gate insulating film 45 to be used as the source/drain metal. Here, the first metal layer 43 is distanced by a predetermined interval from the grinding area II and extends beyond the pad contact area I to the active region. The thin film transistor (not shown) is formed on the active region. For reference, the metal layer for the gate electrode is formed before the gate insulating film 45 is formed. Thereafter, the protective film 47 is formed on a front surface of the substrate 41 including the first metal layer 43.

Figure 6B:
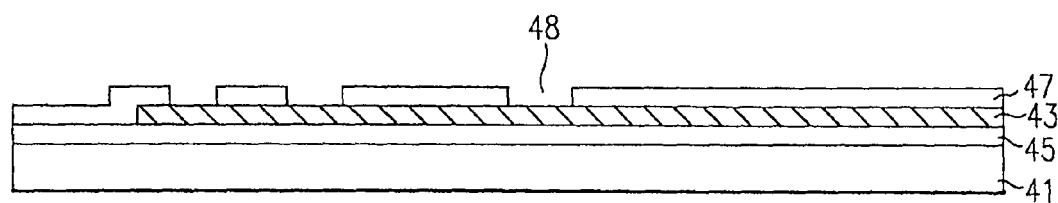

A photoresist (not drawn) is coated on the protective film 47 and patterned through an exposure and development process. Then, as shown in FIG. 6B, the plurality of contact holes 48 are formed within the pad contact area I through an engraving process using the patterned photoresist as a mask.

Figure 6C:
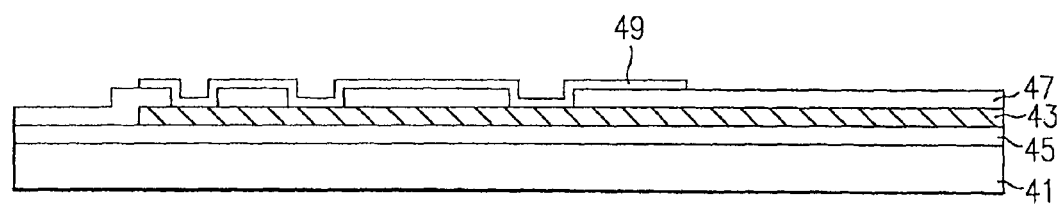

Then, as shown in FIG. 6C, the transparent metal layer 49 is formed within the pad contact area I to be electrically connected to the first metal layer 43 through the contact holes 48. To be specific, a metal material is formed on a front surface including the contact holes 48, and then the transparent metal layer 49 is patterned to be formed within the pad contact area I through a photo-engraving process. Here, the transparent metal layer 49 is materialized of the same ITO as a material of the pixel electrode formed in the active region. However, the material of the transparent metal layer 49 is not limited to the ITO, rather any material having a high electric conductivity and a high adhesivity to the ACF can be used.

Figure 6D:
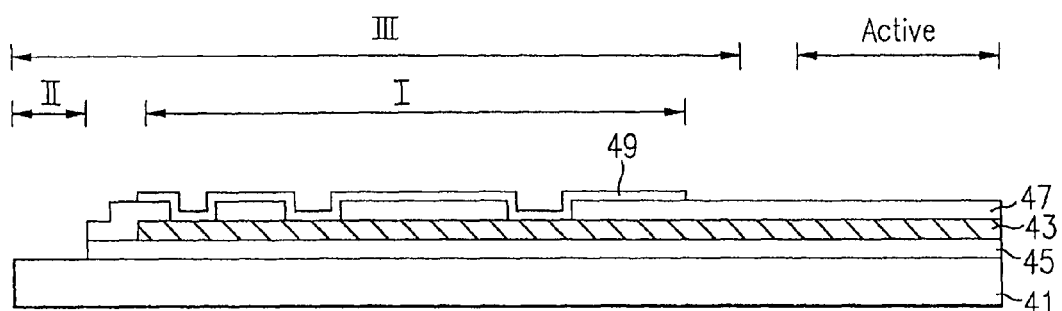
Figure 6E:
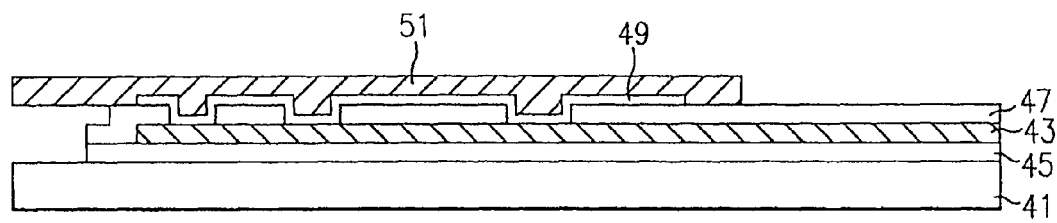

After that, the protective film 47 in the grinding area II is removed through the grinding process as shown in FIG. 6D, and the ACF 51 is formed on the ACF deposit area III to sufficiently cover the pad contact area I as shown in FIG. 6E.

Figure 6F:
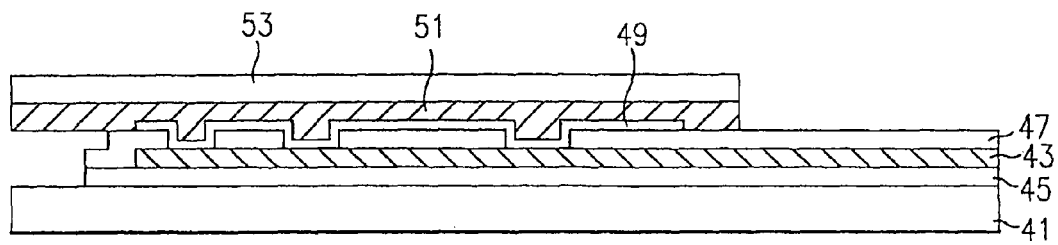

Next, as shown in FIG. 6F, the TCP layer 53 is formed on an upper part of the ACF 51, completing the whole process of manufacturing the data pad according to the present invention. Here, the edge portions of the first metal layer 43 and the transparent metal layer 49 are separated by a predetermined interval from the grinding area II thus, the edge portions of the first metal layer 43 are covered by the protective film 47 so that the edge portions of the first metal layer 43 will not be exposed even after completing the grinding process. In addition, the edge portions of the plurality of contact holes 48 and the transparent metal layer 49 within the pad contact area I are formed within the ACF deposit area III, thereby preventing the transparent metal layer 49 and the contact holes 48 from being exposed to ambient air.

As stated above, the LCD pads and the manufacturing method thereof according to the present invention have a number of advantages. For example, the gate metal and the transparent metal layer in the gate pad are prevented from being exposed to ambient air since the gate metal adjacent to the grinding area remain covered by the gate insulating film and the protective film while the transparent metal layer and the contact holes within the pad contact area remain covered by the ACF. Thus, electrolytic corrosion due to the electrochemical reaction between the metals and the corrosion due to the moisture are prevented.

In addition, the source/drain metal, the transparent metal layer, and the contact holes in the data pad are prevented from being exposed since the source/drain metal remain covered by the protective film while the transparent metal layer and the contact holes within the pad contact area remain covered by the ACF. Thus, electrolytic corrosion due to the electrochemical reaction between the metals and the corrosion due to moisture are prevented. As a result, the present invention is capable of improving reliability in LCD devices since resistance of the metals of the gate pad or the source/drain pad connected to an outside driving circuit is not increased due to corrosion or electrolytic corrosion.

It will be apparent to those skilled in the art that various modifications and variations can be made in the LCD pads of the present invention without departing from the spirit or scope of the invention. Thus, it is intended that the present invention cover the modifications and variations of this invention provided they come within the scope of the appended claims and their equivalents.

What is claimed is:

1. A method for manufacturing a liquid crystal display having, the method comprising the steps of:
    forming gate pads on a substrate;
    forming an insulating film to cover the gate pads;
    forming a protective film on the insulating film;
    forming a plurality of contact holes to expose portions of the gate pads in the insulating film and the protective film;
    forming a transparent conductive layer on the protective film wherein the transparent conductive layer electrically contacts the exposed portions of the gate pads via the plurality of contact holes; and
    forming an anisotropic conductive film on the transparent conductive layer wherein edge portions of the transparent conductive layer are covered by the anisotropic conductive film.

2. The method according to claim 1, wherein the edge portions of the gate pad are covered by the insulating film.

3. The method according to claim 2, wherein the step of forming the insulating film further includes covering a portion of the substrate adjacent to the side surfaces of the gate pad with the insulating film.

4. A method for manufacturing a liquid crystal display, the method comprising the steps of:
    forming an insulating film on a plurality of gate pads;
    forming data pads on the insulating film;
    forming a protective film on the data pads;
    forming a plurality of contact holes to expose portions of the date pads in the protective film;
    forming a transparent conductive layer on the protective film, wherein the transparent conductive layer electrically contacts the exposed portions of the data pads via the plurality of contact holes; and
    forming an anisotropic conductive film on the transparent conductive layer, wherein edge portions of the transparent conductive layer are covered by the anisotropic conductive film.

5. The method according to claim 1, the transparent conductive layer includes indium tin oxide.

6. The method according to claim 4, wherein the edge portions of the gate pad are covered by the protective film.

* * * * *